(12) United States Patent
Hollis

(10) Patent No.: US 8,032,350 B2
(45) Date of Patent: Oct. 4, 2011

(54) TECHNIQUES FOR GENERATING AND SIMULATING A SIMULATABLE VECTOR HAVING AMPLITUDE NOISE AND/OR TIMING JITTER ADDED THERETO

(75) Inventor: Timothy M. Hollis, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 510 days.

(21) Appl. No.: 11/926,682

(22) Filed: Oct. 29, 2007

(65) Prior Publication Data

US 2009/0112549 A1 Apr. 30, 2009

(51) Int. Cl.
*G06F 17/50* (2006.01)
*G06F 17/00* (2006.01)
*G01D 3/00* (2006.01)

(52) U.S. Cl. .......................................... 703/14; 702/124
(58) Field of Classification Search .................... 703/14; 702/124
See application file for complete search history.

(56) References Cited

U.S. PATENT DOCUMENTS 5,682,336 A * 10/1997 Chian et al. ...................... 703/3

OTHER PUBLICATIONS

McCorquodale et al. Study and Simulation of CMOS LC Oscillator Phase Noise and Jitter. [online] 2003 [retrieved on Dec. 11, 2009] IEEE Database.*
Berners, Dave. Ask the Doctors: Resampling Issues. [online] Sep. 2005. [retrieved on Dec. 11, 2009].*
U.S. Appl. No. 11/549,646, filed Oct. 14, 2006, Hollis.
U.S. Appl. No. 11/738,193, filed Apr. 20, 2007, Hollis.
Documentation for PRBSsrc (Psuedo-Random Bit Sequence Source) for Agilent Technologies' Advanced Design System (ADS)™, as accessed on Oct. 8, 2007.
Documentation for ClockWjitter (Voltage Source: Clock with Jitter) for Agilent Technologies' Advanced Design System (ADS)™, as accessed on Oct. 8, 2007.
"Clock Source with Random Jitter," HSPICE RF User Guide Z-2007.03.
Documentation for SynaptiCAD's Waveformer™ module, as downloaded from http://www.syncad.com/syn_time_analysis.htm#clock as downloaded Oct. 8, 2007.
Tektronix, "Controlled Jitter Generation for Jitter Tolerance and Jitter Transfer Testing", Appl. Note 61W-18431-3, 2005. (C& from original app).
K. K. Kim et al., "On the modeling and analysis of jitter in ATE using Matlab," in Proceedings of the IEEE International Symposium on Defect and Fault Tolerance in VLSI Systems, p. 285-93 (Oct. 2005).
S. Tabatabaei et al., "Jitter generation and measurement for test of multi-Gbps serial IO," in Proceedings of the ITC International Test Conference, pp. 1313-1321 (Oct. 2004).

* cited by examiner

*Primary Examiner* — David Silver
*Assistant Examiner* — Suzanne Lo
(74) *Attorney, Agent, or Firm* — Wong, Cabello, Lutsch, Rutherford & Brucculeri, LLP

(57) ABSTRACT

Methods for generating realistic waveform vectors with controllable amplitude noise and timing jitter, simulatable in a computer-based simulation environment are disclosed. In one implementation, a transition vector is created from a sequence of bits having a rise time and a fall time, in which the transition vector comprises voltage values at timings corresponding to midpoints of transitions in the bit sequence. A jittered transition vector is created from the transition vector, in which the timing of the transitions in the jittered transition vector include timing jitter. An upscaled jittered transition vector is then formed having additional points, in which at least some of the additional points comprise corners of the sequence of bits. The voltages of the additional points are set by the sequence of bits, and the timing of the corners are set in accordance with the rise time and the fall time. Although this resulting vector can be simulated, this vector can also be re-sampled to produce a new simulatable vector in which the voltages are separated by a constant time step.

24 Claims, 10 Drawing Sheets

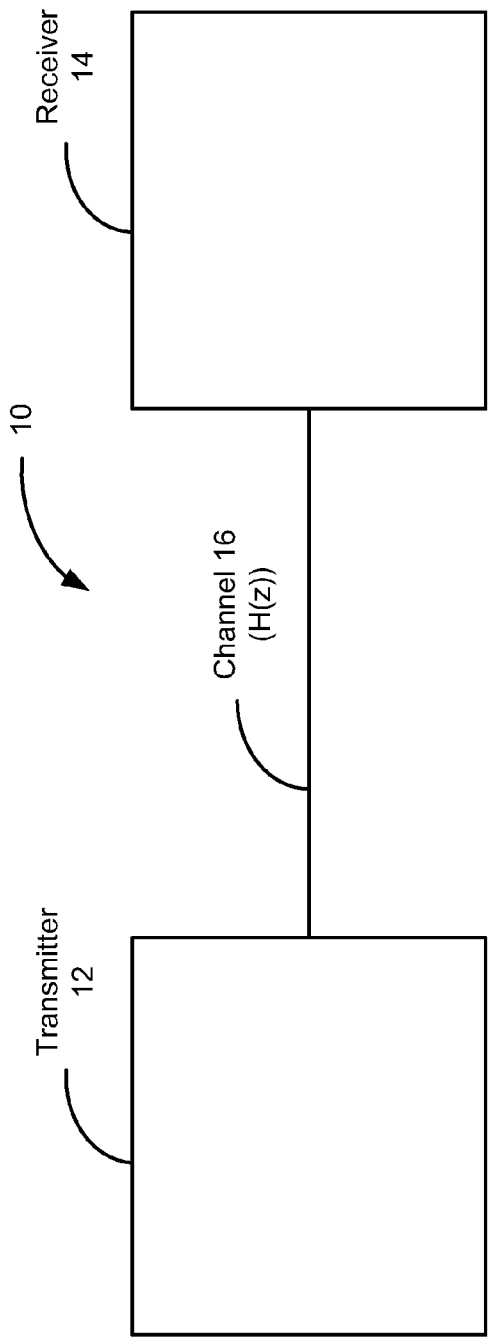
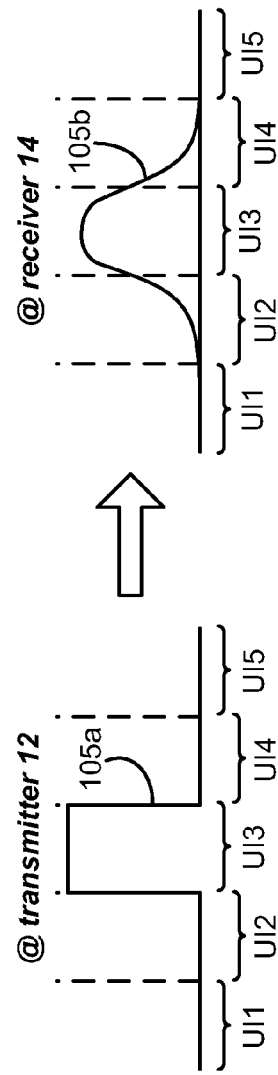
Figure 1A (prior art)
Figure 1B (Prior Art)

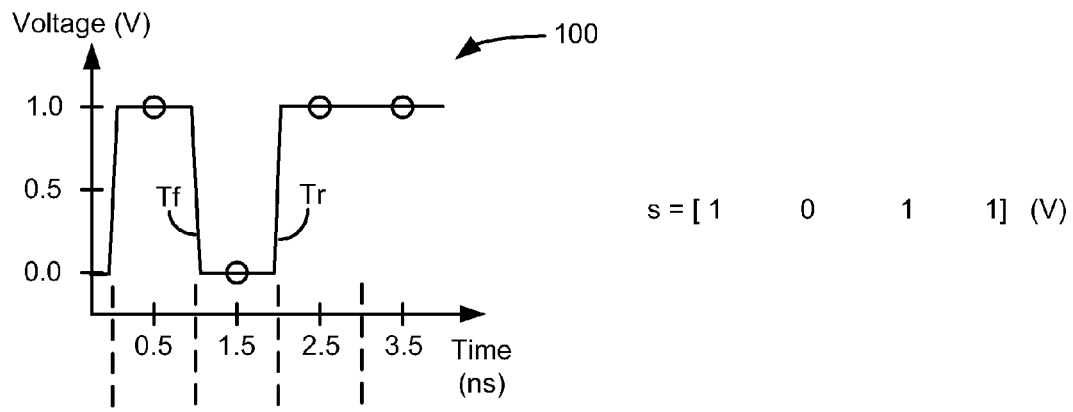
*Figure 2*
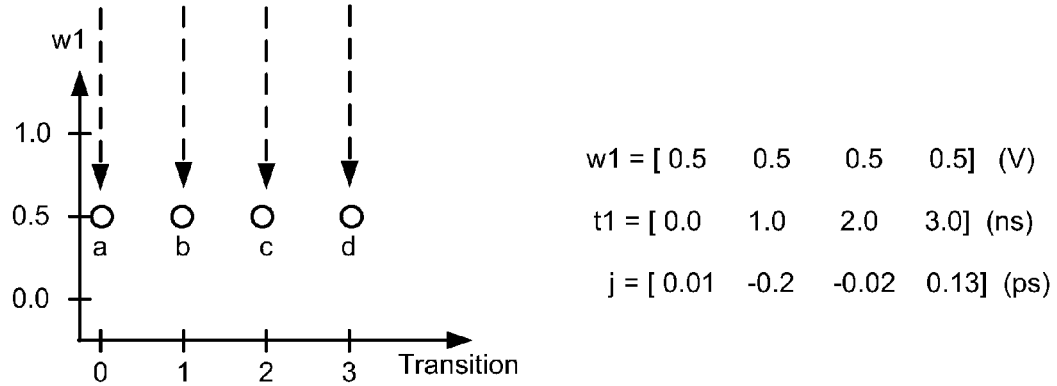
*Figure 3A*
| [ t1 ] | [ 0.0 | 1.0 | 2.0 | 3.0 ] |
| --- | --- | --- | --- | --- |
| + [ j1 ] | + [ 0.00001 | -0.0002 | -0.00002 | 0.00013 ] |
| = [ t2 ] | = [ 0.00001 | 0.9998 | 1.99978 | 3.00013 ] |
*Figure 3B*

$$t2 = \begin{bmatrix} 0.00001 \\ 0.9998 \\ 1.99978 \\ 3.00013 \end{bmatrix} \text{(ns)} \qquad w2 = \begin{bmatrix} 0.5 \\ 0.5 \\ 0.5 \\ 0.5 \end{bmatrix} \text{(V)}$$

*Figure 3C*

$$t3 = \begin{bmatrix} 0.00001 \\ 0 \\ 0 \\ 0.9998 \\ 0 \\ 0 \\ 1.99978 \\ 0 \\ 0 \\ 3.00013 \\ 0 \end{bmatrix} \text{(ns)} \qquad w3 = \begin{bmatrix} 0.5 \\ 0.0 \\ 0.0 \\ 0.5 \\ 0.0 \\ 0.0 \\ 0.5 \\ 0.0 \\ 0.0 \\ 0.5 \\ 0.0 \end{bmatrix} \text{(V)}$$

*Figure 4*

$$t_7 = \begin{bmatrix} 0.000 \\ 0.025 \\ 0.050 \\ 0.075 \\ 0.100 \\ 0.125 \\ 0.150 \\ 0.175 \\ 0.200 \\ 0.225 \\ 0.250 \\ 0.275 \\ 0.300 \\ 0.325 \\ 0.350 \\ 0.375 \\ 0.400 \\ 0.425 \\ 0.450 \\ 0.475 \\ 0.500 \\ 0.525 \\ 0.550 \\ 0.575 \\ 0.600 \\ 0.625 \\ 0.650 \\ 0.675 \\ 0.700 \\ 0.725 \\ 0.750 \\ 0.775 \\ 0.800 \\ 0.825 \\ 0.850 \\ 0.875 \\ 0.900 \\ 0.925 \\ 0.950 \\ 0.975 \\ 1.000 \end{bmatrix} \text{(ns)} \qquad w_7 = \begin{bmatrix} 0.498 \\ 0.833 \\ 1.000 \\ 1.000 \\ 1.000 \\ 1.000 \\ 1.000 \\ 1.000 \\ 1.000 \\ 1.000 \\ 1.000 \\ 1.000 \\ 1.000 \\ 1.000 \\ 1.000 \\ 1.000 \\ 1.000 \\ 1.000 \\ 1.000 \\ 1.000 \\ 1.000 \\ 1.000 \\ 1.000 \\ 1.000 \\ 1.000 \\ 1.000 \\ 1.000 \\ 1.000 \\ 1.000 \\ 1.000 \\ 1.000 \\ 1.000 \\ 1.000 \\ 1.000 \\ 1.000 \\ 1.000 \\ 1.000 \\ 1.000 \\ 1.000 \\ 0.913 \\ 0.500 \end{bmatrix} \text{(V)}$$

*Figure 7B*

$$t8 = \begin{bmatrix} 0.000 \\ 0.025 \\ 0.050 \\ 0.075 \\ 0.100 \\ 0.125 \\ 0.150 \\ 0.175 \\ 0.200 \\ 0.225 \\ 0.250 \\ 0.275 \\ 0.300 \\ 0.325 \\ 0.350 \\ 0.375 \\ 0.400 \\ 0.425 \\ 0.450 \\ 0.475 \\ 0.500 \\ 0.525 \\ 0.550 \\ 0.575 \\ 0.600 \\ 0.625 \\ 0.650 \\ 0.675 \\ 0.700 \\ 0.725 \\ 0.750 \\ 0.775 \\ 0.800 \\ 0.825 \\ 0.850 \\ 0.875 \\ 0.900 \\ 0.925 \\ 0.950 \\ 0.975 \\ 1.000 \end{bmatrix} \text{(ns)} \quad w8 = \begin{bmatrix} 0.497 \\ 0.836 \\ 0.999 \\ 1.002 \\ 1.000 \\ 1.001 \\ 0.998 \\ 1.004 \\ 1.002 \\ 0.999 \\ 0.999 \\ 1.000 \\ 1.001 \\ 1.001 \\ 0.998 \\ 1.000 \\ 0.998 \\ 0.999 \\ 1.002 \\ 0.999 \\ 0.997 \\ 1.002 \\ 0.997 \\ 1.002 \\ 0.995 \\ 0.996 \\ 1.000 \\ 1.001 \\ 1.000 \\ 1.000 \\ 1.005 \\ 1.002 \\ 1.004 \\ 1.000 \\ 0.999 \\ 1.000 \\ 1.000 \\ 1.002 \\ 1.000 \\ 0.912 \\ 0.501 \end{bmatrix} \text{(V)}$$

*Figure 7D*

TECHNIQUES FOR GENERATING AND SIMULATING A SIMULATABLE VECTOR HAVING AMPLITUDE NOISE AND/OR TIMING JITTER ADDED THERETO

FIELD OF THE INVENTION

Embodiments of this invention relate to improved methods for generating signals in a computerized simulation environment, and in particular for improving the modeling of amplitude noise and timing jitter in the signals being simulated.

BACKGROUND

Circuit designers of multi-Gigabit systems face a number of challenges as advances in technology mandate increased performance in high-speed components. For example, chip-to-chip data rates have traditionally been constrained by the bandwidth of input/output (I/O) circuitry in each component. However, process enhancements (e.g., transistor bandwidth) and innovations in I/O circuitry have forced designers to also consider the effects of the transmission channels between the chips on which data is sent.

At a basic level, data transmission between components within a single semiconductor device or between two devices on a printed circuit board may be represented by the system 10 shown in FIG. 1A. In FIG. 1A, a transmitter 12 (e.g., a microprocessor) sends data over channel 16 (e.g., a copper trace on a printed circuit board or "on-chip" in a semiconductor device) to a receiver 14 (e.g., another processor or memory). When data is sent from an ideal transmitter 12 to a receiver 14 across an ideal (lossless) channel 16, all of the energy in a transmitted pulse will be contained within a single time cell, which is referred to hereinafter as a unit interval (UI).

However, real transmitters and real transmission channels do not exhibit ideal characteristics. Due to a number of factors, including, for example, the limited conductivity of copper traces, the dielectric medium of the printed circuit board (PCB), and the discontinuities introduced by vias, the initially well-defined digital pulse will tend to spread or disperse as it passes through the channel 16. This is shown in FIG. 1B. As shown, a single pulse of data 105a is sent by the transmitter 12 during a given UI (e.g., UI3). However, because of the effect of the channel 16, this data pulse becomes spread 105b over multiple UIs at the receiver 14, i.e., some portion of the energy of the pulse is observed outside of the UI in which the pulse was sent (e.g., in UI2 and UI4). This residual energy outside of the UI of interest may perturb a pulse otherwise occupying the neighboring UIs, in a phenomenon referred to as intersymbol interference (ISI).

Because of the potentially negative impact of ISI on the reliability of data transfer and detection at the receiver 14, such data transfer is often simulated in a computer system using simulation software. The design of a high-speed system 10 typically involves iterations of circuit-level simulation to ascertain whether or not the system 10 has performed within suitable tolerances, and this of course requires a waveform vector suitable for simulation using simulation software. Simulation is a valuable tool in the semiconductor industry, where it is generally very expensive to design and produce a given integrated circuit. The use of simulation software allows the circuit designer to verify the operation and margins of a circuit design before incurring the expense of actually building and testing the circuit. Through the use of simulations, design errors or risks are hopefully identified early in the design process, and resolved prior to fabrication. Unfortunately, modeling and simulation of realistic waveforms that accurately reflect subtle characteristics of a signal is difficult. It is generally necessary to define a waveform in a layout simulator such as SPICE™. This requires transistors, resistors, and other discrete components to be electronically considered, even if they are not actually yet constructed or laid out. Such component-level consideration takes considerable time and effort.

Further, modeling and simulation may not provide a suitably accurate picture of how the system 10 will process real signals. Realistic data signals will not be ideal, but instead will suffer from various sources of amplitude noise and timing jitter, which may vary randomly between the unit intervals of the data. Regardless of the source or type of amplitude noise or timing jitter, it is difficult to quickly and efficiently simulate the effects of amplitude noise and timing jitter in the context of a system 10.

The challenge associated with simulating noise- or jitter-affected signals is highly correlated to the characteristics of the degradation. Signals in any transmission medium experience both random and deterministic degradation. Random degradation, in the form of random Gaussian distributed amplitude noise and timing jitter, which stem from thermal and shot noise, requires statistical quantification. Similarly, deterministic amplitude noise and timing jitter are linked to several sources including power supply noise, inter-channel crosstalk, impedance discontinuities, component variance, and at high frequencies the response of the channel. These factors result in a variety of observable characteristics, from periodicity to uncorrelated-bounded randomness. To model these noise components correctly requires the ability to designate their probability during the noise generation stage and consequently inject or superimpose these effects onto the underlying signal in a way reflecting what occurs in the actual system. The final success or robustness of a particular design is dependent, to a large measure, on the achieved realism of the simulation environment.

To date, industry standard simulators do not provide the level of amplitude noise and timing jitter generation control necessary to model a realistic communication channel, though some jitter adding features have recently become available. Agilent's Advanced Design System (ADS) tool, Synopsys's Hspice, and Synapticad's WaveformerPRO all offer stock waveforms with additive jitter, but the features are limited in several ways. First of all, in the cases of ADS and Hspice, the jitter exhibited by the waveform may take on one of a few standard forms: it may either exhibit a Gaussian probability distribution or a periodic jitter distribution (e.g. sinusoidal distribution, etc.), but combinations of random and periodic jitter distributions are limited both in terms of the number of permitted jitter sources per signal and the peak magnitude of the jitter. In addition there is no clear mechanism for adding amplitude noise in the time-domain. WaveformerPRO claims even less, allowing the user to define a peak-to-peak jitter value, but offering no control over the statistical characteristics of the jitter. While all three tools provide jittery clock sources, only Agilent's tool allows for jitter added to random data sequences. And while the random data may be manually altered by the user, the length of a user defined sequence is limited to $2^{32}-1$ bits. So while one can find clock and random data sources exhibiting a limited selection of jitter characteristics, a tool has yet to emerge providing the user the ability to produce simulatable waveforms of arbitrary data patterns, of arbitrary length, exhibiting arbitrary jitter and amplitude noise characteristics.

It is possible to formulate piecewise linear functions (PWLs) with tools like Matlab, as well as within Spice-based simulators, through the careful architecting of time and voltage vectors, where the voltage amplitude is designated for each step in time. But to approximate Gaussian distributed noise and jitter, as well as other specific noise distributions, over hundreds or thousands of cycles using known methods is daunting.

Another challenge in simulating realistic signaling environments is tied to the underlying statistical assumption that sufficient samples of the behavior to be characterized are readily available. As such, it is becoming necessary to include more and more cycles with each simulation. As the relative size of each individual noise component is very small with respect to the overall cycle period, fine voltage and timing resolution are necessary. While the timing resolution of a simulation may be enhanced by decreasing the time span between each calculation (i.e., the simulated time step), this leads to a simultaneous increase in both the simulation run time and the memory requirement. When fine simulation resolution is coupled with a greater number of simulated cycles, the result is an enormous amount of data and prohibitively lengthy simulation times. It is not uncommon for transistor-level transient (time-based) simulations to run for hours or even days. It is likewise not uncommon for such a simulation to fail due to a lack of memory resources.

Perhaps the strongest argument for developing full signals with noise and jitter is the impact of ISI, mentioned briefly above. While unbounded Gaussian noise and jitter lead to long term bit errors, depending upon the bandwidth of the channel, ISI and the corresponding data-dependent jitter (DDJ) may dominate the short term signal degradation. Recent papers have proposed methods for predicting the DDJ distribution from the relationship of the data-rate and the channel bandwidth, see J. Buckwalter et al., "Predicting Data-Dependent Jitter," IEEE Transactions on Circuits and Systems II: Express Briefs, vol. 51, no. 9, pp. 453-457 (September 2004).

With the following background in hand, it should be apparent that an improved signal simulation technique would at least allow for the generation of various kinds of and lengths of signals, with good computational efficiency, and allow for the formation a signal for simulation in which amplitude noise and timing jitter of any resolution are easily and realistically modeled. The disclosed techniques achieve such results in a manner easily implemented in a typical computerized system or other computerized circuit simulation software package.

BRIEF DESCRIPTION OF THE DRAWINGS

Embodiments of the present invention will be best understood with reference to the following detailed description, when read in conjunction with the accompanying drawings, in which:

FIG. 1A illustrates a block diagram of a transmission system on a printed circuit board.

FIG. 1B illustrates the effect of a transmission channel on pulses sent across the channel, and in particular shows intersymbol interference (ISI).

FIG. 2 illustrates a bit sequence from which a simulatable vector will be created pursuant to the disclosed technique.

FIGS. 3A-3C illustrate the creation of a jittered transition vector and its associated jittered transition timing vector.

FIG. 4 illustrates upsampled versions of the jittered transition vector and its associated jittered transition timing vector.

FIGS. 7A and 7B illustrate a sampled vector suitable for simulation.

FIGS. 7C and 7D illustrate the addition of amplitude noise to the vector of FIGS. 7A and 7B.

DETAILED DESCRIPTION

Figure 5A:
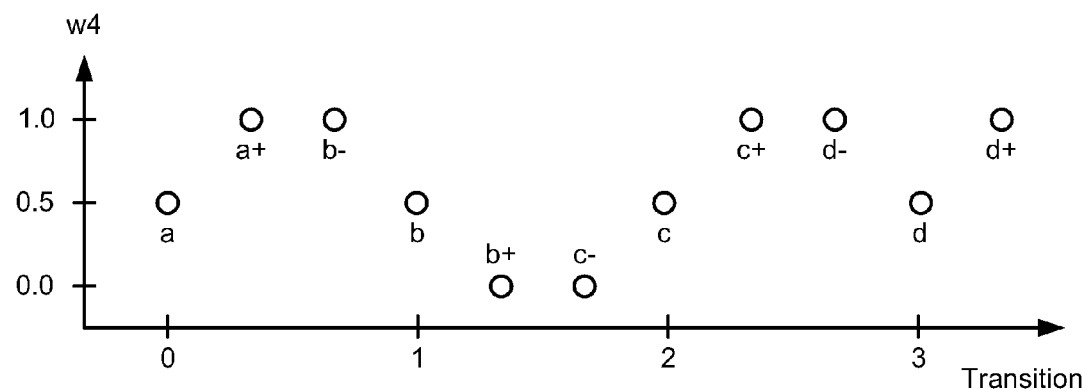
FIGS. 5A and 5B illustrates modification of the upscaled jittered transition vector to reflect realistic voltage values in light of the bit sequence.

Methods for generating realistic waveform vectors with controllable amplitude noise and timing jitter, simulatable in a computer-based simulation environment are disclosed. The precision of the signals generated by the disclosed techniques is constrained only by numerical limitations of the underlying computer system used to generate and/or simulate the waveform. Briefly, and in one implementation, a transition vector is created from a sequence of bits having a rise time and a fall time, in which the transition vector comprises voltage values at timings corresponding to midpoints of transitions in the bit sequence. A jittered transition vector is created from the transition vector, in which the timing of the transitions in the jittered transition vector include timing jitter. An upscaled jittered transition vector is then formed having additional points, in which at least some of the additional points comprise corners of the sequence of bits. The voltages of the additional points are set by the sequence of bits, and the timing of the corners are set in accordance with the rise time and the fall time. Although this resulting vector can be simulated, this vector can also be sampled to produce a new simulatable vector in which the voltages are separated by a constant time step.

FIG. 2 shows a bit sequence 100 obtained from user input. This bit sequence 100 represents a series of bits to be used for simulation in the system 10 shown in FIG. 1. One of ordinary skill in the art will appreciate that such a bit sequence 100 may be obtained in a number of manners. For example, the bit sequence 100 may be generated randomly by software, based on a defined pattern, or input by a user. Alternatively, the bit sequence 100 may be a user-defined bit sequence having a training pattern, which is useful, for example, for training or simulating a hardware device. A vector s depicting the voltage values for each bit in the bit sequence 100 is shown next to the graph of FIG. 2. Although the bits are shown as comprising binary values, it should be understood that the bits may take on any magnitude values which deviate from ideal levels, and accordingly the voltage levels as depicted in vector s can comprise a continuity of voltages or other digits. For simplicity in illustrating the technique, it is assumed that the bits in the bit sequence 100 have voltage values of 1V or 0V. As can be seen in the graph, the bit sequence 100 has transitions, i.e., rising edges and falling edges, with corresponding rise times and fall times of Tr and Tf. Such rise and fall times Tr and Tf are known to the designer of the system 10 through experimentation, simulation or other means, or they may be designated by the software based on related characteristics of the user-defined waveform, such as the signal period.

To create a simulatable vector from the bit sequence in accordance with the disclosed technique, a transition vector w1 is first created, which contains the voltages of the transition midpoints from the bit sequence 100. FIG. 3A shows a graph of the transition midpoints a-d as represented in transition vector w1. The magnitudes of the voltages of the transition midpoints can be determined in one implementation as the average of the voltages of the bits on either side of a given transition. For example, if a first bit in the bit sequence 100 had a voltage of 0.9 and the second bit had a voltage of −0.1 V, the magnitude of the transition between them (e.g., transition midpoint a) would be 0.4 V. However, in the depicted implementation, because ideal voltages of 0 and 1 are assumed for the bits, all transition midpoints a-d have a midpoint voltage of 0.5V.

In the depicted embodiment, notice that transition midpoints a-d are created, and represented in transition vector w1, even if no transition actually occurs in the bit sequence 100. For example, transition midpoint d is represented as such, and with a voltage of 0.5 V, even though the bits on either side are both 1V. So representing d as a transition midpoint is therefore optional in some implementations of the disclosed technique. However, for ease in processing, and as shown, it can be easier to designate the boundaries between all bits as transition midpoints, and then deal with the reality that some are not actually transitions later in the process (see, e.g., FIG. 5B).

It is necessary to keep track of the timing of the transition midpoints a-d in the transition vector w1. In this regard, it is helpful to additionally create a transition timing vector t1 to so track such timings. However, timing of the midpoints can be tracked in other ways, and use of a discrete vector is not necessary. Because the transitions in the bit sequence 100 appear at given intervals (0.0, 1.0, 2.0, 3.0 ns), these timings are so reflected in the transition timing vector t1.

In one implementation of the disclosed technique, timing jitter is added to the technique at this point. As noted earlier, it is beneficial to the simulation of realistic signals to create vectors having timing jitter and/or amplitude noise. Fortunately, the disclosed technique handles timing jitter and amplitude noise independently, and in a computationally efficient manner.

As shown in FIG. 3A, a timing jitter vector j is created, which represents the timing jitter encountered at each transitions a-d. For example, although transition timing vector t1 assumes that transition b will take place at 1.0 ns, the timing jitter vector shifts that transition by −0.2 ps to 0.9998 ns. There is typically a one-to-one relationship between elements in the timing jitter vector j and the transition timing vector t1, but this in not strictly necessary; instead the timing jitter vector j may be any length so long as the relationship between elements of the timing jitter vector j and the transition timing vector t1 can be interpreted.

As alluded to above, the timing jitter vector j is added, element-by element, to the transition timing vector t1, to form a jittered transition timing vector t2, as shown in FIG. 3B. The timing jitter as represented in timing jitter vector j may be derived in several ways, and accordingly may represent a number of types of jitter. It may be defined initially in terms of a probability density function (PDF), from which the timing jitter vector j may be extracted, or it may be defined directly as a set of timing offsets to be combined with the ideal transition timing. A method for extracting the timing jitter vector j from a PDF is described in U.S. patent application Ser. No. 11/868,145, filed Oct. 5, 2007. For example, the timing jitter vector j may represent Gaussian distributed jitter, sinusoidal distributed jitter, duty cycle distortion, or other forms of jitter. Moreover, more than one such timing jitter vector may be applied to the transition timing vector t1. For example, both random and periodic jitter vectors (e.g., one jitter vector j1 having Gaussian distributed random jitter and another j2 having sinusoidal jitter; not shown) may be combined and added to the transition timing vector t1 to form the jittered transition timing vector t2. Using the described approach, the available jitter characteristics are only limited in the sense that the final signal, including jitter, should maintain causality (e.g., the order of transitions should be maintained). When associated with the transition vector, the result is a jittered transition vector w2, as shown in FIG. 3C.

Although the Figures illustrate the addition of timing jitter at this point in the technique, timing jitter may be added at subsequent stages as well.

Once the jittered timing vector t2 and the jittered transition vector w2 are formed, it becomes convenient to upsample them. Upsampling is a process which adds additional points to the starting vectors t2 and w2 to form new vectors t3 and w3. As shown, the new vectors t3 and w3 are upsampled by a factor of three, meaning that for each point in the starting vectors t2 and w2 (e.g., b), two additional points (e.g., b− and b+) are inserted, such that for each original point there are now three points in the new vectors. Upsampling may be accomplished on nearly any computer software program capable of modifying vectors (e.g., Matlab, Microsoft Excel, etc.), which programs may or may not be associated with the simulation software that will ultimately be used to simulate the vector the method creates.

The additional points added as a result of upsampling are illustrated in the vectors t3 and w3 of FIG. 4 as highlighted by dotted line boxes. These additional points simply receive a placeholder value (e.g., 0 in t3), although other default values could be used as well. The additional points will in subsequent steps be modified to represent the corners of rising or falling transitions, with points b−, c−, and d− indicating the beginning of such transitions, and points a+, b+, c+, and d+ indicating the ending of such transitions.

As illustrated in FIG. 3B, the timing vector is jitterized prior to upscaling. However, upscaling and jitter addition could occur in reverse order, with either order rendering the vectors t3 and w3 of FIG. 4.

Once the basic upscaled vectors t3 and w3 are formed, the additional points in vector w3 are provided with realistic voltage values instead of mere placeholder values. This is illustrated in FIG. 5A. The realistic voltage values are provided by the bit stream vectors of FIG. 2, which informs as to the magnitude of the voltage of the various bits between the transitions. For example, the bit between transitions a and b has a voltage of 1.0V. (Compare FIGS. 2 and 3A). Therefore, upsampled points a+ and b− are updated in new vector w4 with the appropriate value of 1.0 V. Likewise, because the next bit is 0.0 V, upsampled points b+ and c− are updated to 0.0V in new vector w4, etc.

Figure 5B:
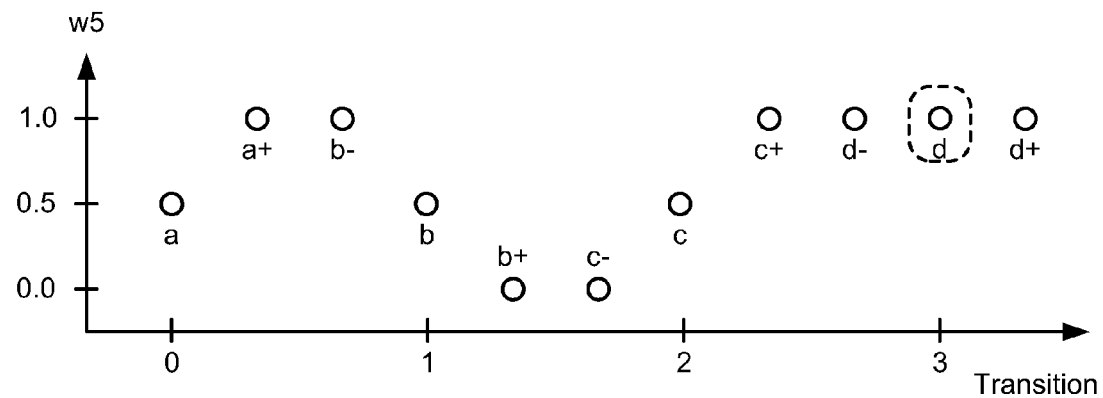

As mentioned earlier in conjunction with FIG. 3A, transition points a-d may have been designated as transitions when analysis of the bit stream 100 would show that no transition was really occurring between certain bits. As noted, that was the case with transition point d, which in reality did not comprise a transition because the bits on either side of this boundary (d−, d+) comprise a high logic state of 1.0V. Because this was not addressed earlier in the technique, as it could have been, it is advantageous to address it now as illustrated in FIG. 5B. More specifically, transition midpoint d is modified from its default value to the appropriate voltage (1.0V) to match the bits on either side by assigning d the average of d− and d+, resulting in new vectors t5 and w5. This step of FIG. 5B may not be necessary when generating certain signals having alternating bits, such as in a clock signal.

Through this step of FIG. 5B, the points that were inserted through the process of upsampling are recognizable as the beginning and end points of the transitions in vector w5. More specifically, the first additional point a+ after transition midpoint a is recognizable as a corner point for the first rising edge, while the second and third upsampled bits b− and b+ are recognizable as the corners for the falling edge appearing at transition midpoint b, etc.

Now that vector w5 has been adjusted to include appropriate voltage values in light of the bit sequence 100, the next step in the disclosed technique involves modification of the timing vector, which has otherwise remained unchanged since being jittered and upsampled. Actually, these adjustments to the timing vector (FIG. 6) can be made concurrently with the adjustments to the transition vectors just described (FIGS. 5A, 5B). However, such adjustments are shown serially for ease of illustration.

Figure 6:
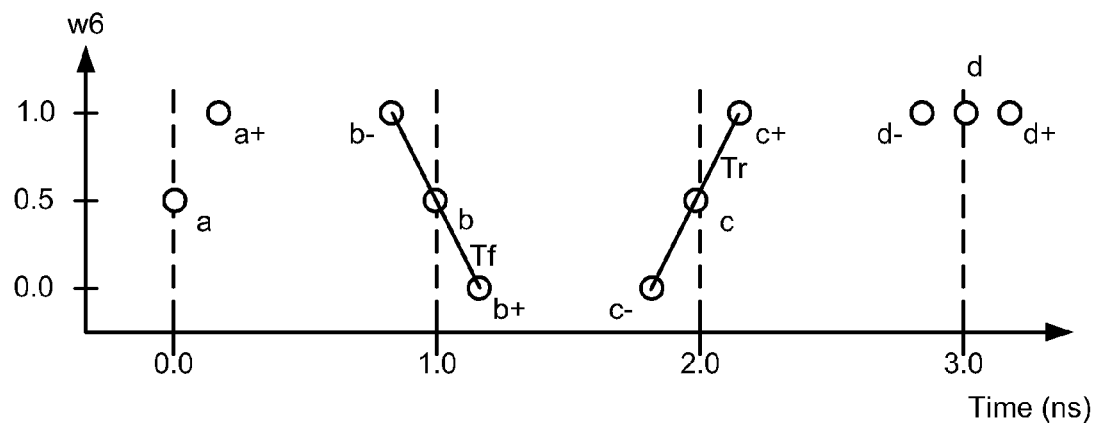
FIG. 6 illustrates modification of the upscaled jittered transition timing vector to correct the timing of the corners in light of the rise and fall times of the bit sequence.

The default timing values for the additional points (0) are adjusted to realistic values to match the basic shape of the bit stream 100. This requires some knowledge or assumption as to the shape of the transition edges of the bit stream 100, such as is provided by the rise time Tr and the fall time, Tf. Knowing these values, the timing of the additional points in the timing vector can be extrapolated using the timing (actually, jittered timing) of the midpoints a-d. For example, assume the rise time Tr and the fall time Tf both equal 0.06 nanoseconds (ns). From these values, appropriate values for the additional points in timing vector can be extrapolated. For example, additional point a+ represents the end of a rising transition; therefore half of the rising time Tr (0.03 ns) is added to the timing of transition midpoint a (0.00001 ns), resulting in a value of 0.03001 ns. Similarly, because b− represents the beginning of a falling transition, half of the fall time Tf (0.03 ns) is subtracted from the timing of transition midpoint b (0.9998 ns), resulting in a value of 0.9698 ns. When these values are populated into a new timing vector t6, as shown in FIG. 6, the results are an upscaled jittered transition timing vector t6 which accompanies upscaled jittered transition vector w6. These vectors t6 and w6, as is apparent when graphed in FIG. 6, represent all significant changes in the bit stream 100 to be simulated. For example, it is now clear that the bit stream rises to a voltage of 0.5V at a time of 0.00001 ns. At 0.03001 ns, this transition reaches its peak at 1.0V, which is maintained until time 0.9698 ns when the bit stream begins to fall, etc.

Figure 7A:
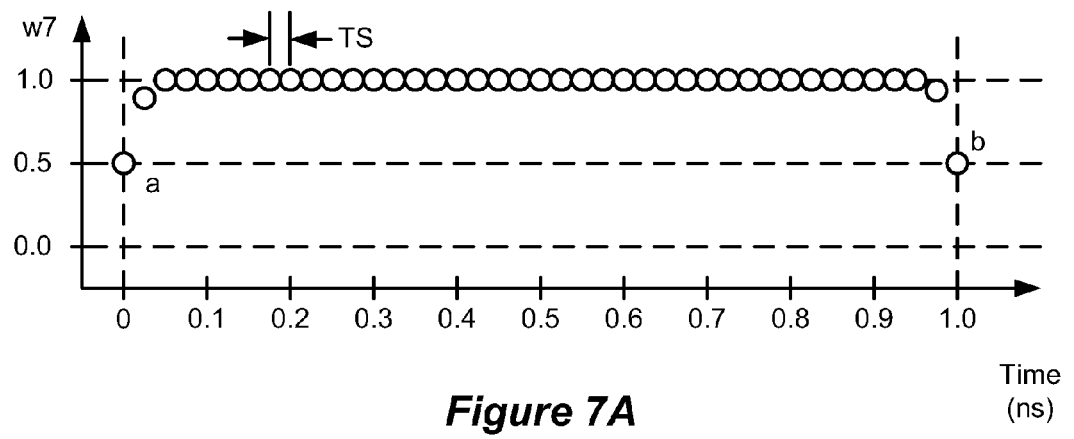

After the upscaled jittered transition timing vector t6 and the upscaled jittered transition vector w6 are completed, these vectors can be re-sampled on a time step basis to form new vectors t7 and w7, as shown in FIGS. 7A and 7B. Re-sampling of the vectors in this manner may be performed to produce a simulatable vector w7 having samples spaced at a desired time step (TS) (i.e., interval). Such a time step may be user-specified, or may be dictated by the simulation software for which the simulatable vector w7 is prepared. In one embodiment, the time step is equivalent to the smallest unit of time resolvable in jittered timing vectors (e.g., 0.01 ps), which usually results in a vector with enough detail to simulate a high speed, high frequency signal. However, a much larger time step of 0.025 ns is used in FIGS. 7A-7D to better illustrate use of the technique. The sampling operation may be performed using a number of standard software programs, including, for example, Matlab, which uses interpolative methods as is well known. In short, sampling provides a simulatable vector w7 indicative of the bit stream, but with jitter added thereto, and which is ready for input into a simulation program.

Figure 7C:
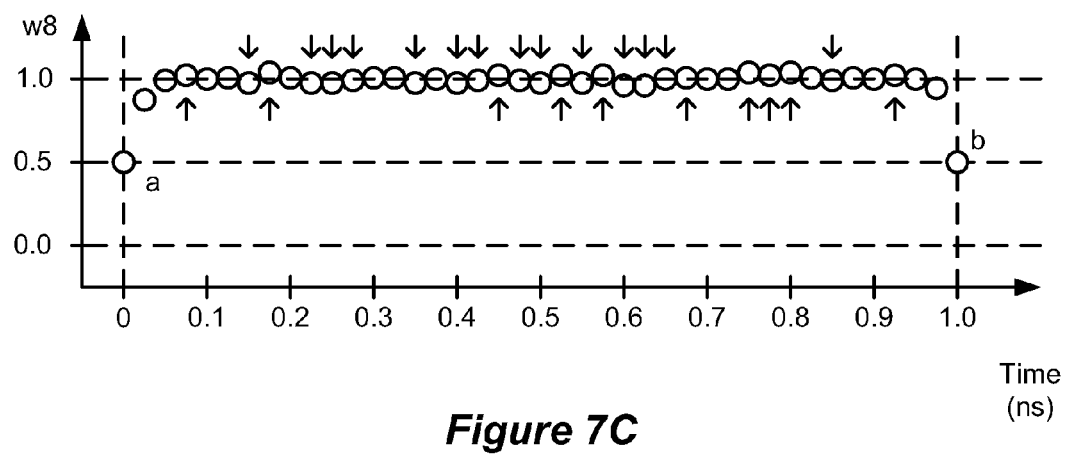

After the vectors t7 and w7 are sampled for formatting on a time step basis, other operations may be performed. For example, as shown in FIGS. 7C and 7D, amplitude noise may be added to the simulatable vector w7 to produce a noise-modified simulatable vector w8. As its name implies, such noise perturbs the amplitude of the elements in the vector, which noise can include Gaussian distributed noise, sinusoidal distributed noise, or other forms of noise. Amplitude noise, like timing jitter as discussed earlier, may be defined in terms of a probability density function (PDF). In FIG. 7C, the noise-modified voltages are shown with arrows indicating the direction of noise-induced perturbation. Note also that such amplitude noise is easily added, and moreover is added independent of timing jitter. Amplitude noise can also be added earlier in the process as well.

The end result are vectors w7 (FIG. 7B) or w8 (FIG. 7D) that are now in a suitable format to be input into a standard simulation software package such as Spice™. One skilled in the art will appreciate that while the corresponding timing vectors t7 or t8 have been depicted to better illustrate the disclosed technique, in the end, such vectors are not necessarily required by the simulation software and may be regarded as intermediate in nature. Instead, the simulation software may only require the time step (TS) that the timing vectors t7 and t8 represent, which as illustrated is 0.025 ns, but in reality might be closer to 0.01 ps as already mentioned. However, while the timing vectors in a given implementation can be viewed as merely intermediary tools to arrive at the simulatable vectors w7 or w8, they can also be used by other types of simulator programs allowing for the inputs of such formats. For example, some simulator packages may not strictly requires vectors created on a time step basis. In such a case, it may be satisfactory to use the vectors t6 and w6 (FIG. 6) for simulation as they existed prior to sampling.

Advantageously, simulatable vectors w7 or w8 have been efficiently created without an excess of computation, which allows vectors of many cycles to be easily created. Moreover, these created vectors are easily modified to include various forms of noise, such as timing jitter (FIG. 3B), or amplitude noise (FIG. 7C). As noted earlier, the ability to efficiently create realistic signals with such noise is beneficial to accurate and meaningful simulation.

Although one particular embodiment of the disclosed technique has been disclosed in the figures, one skilled in the art will realize that other modifications are possible once the present disclosure is appreciated. For example, many of the illustrated steps in the technique can be performed concurrently, and other steps may be performed in reverse order from the manner in which they were set forth here. Indeed, the method claims below should not be interpreted as requiring any particular order of the steps. Additionally, although the technique is described for ease of illustration as involving the creation of a number of vectors on the way to creating a simulatable vector, it should be understood that such steps can involve modification of vectors already present, as opposed to the generation of completely new vectors. Thus an existing, idealized waveform may be replaced with a realistic noisy/jittery waveform to allow for more realistic simulation.

Figure 8:
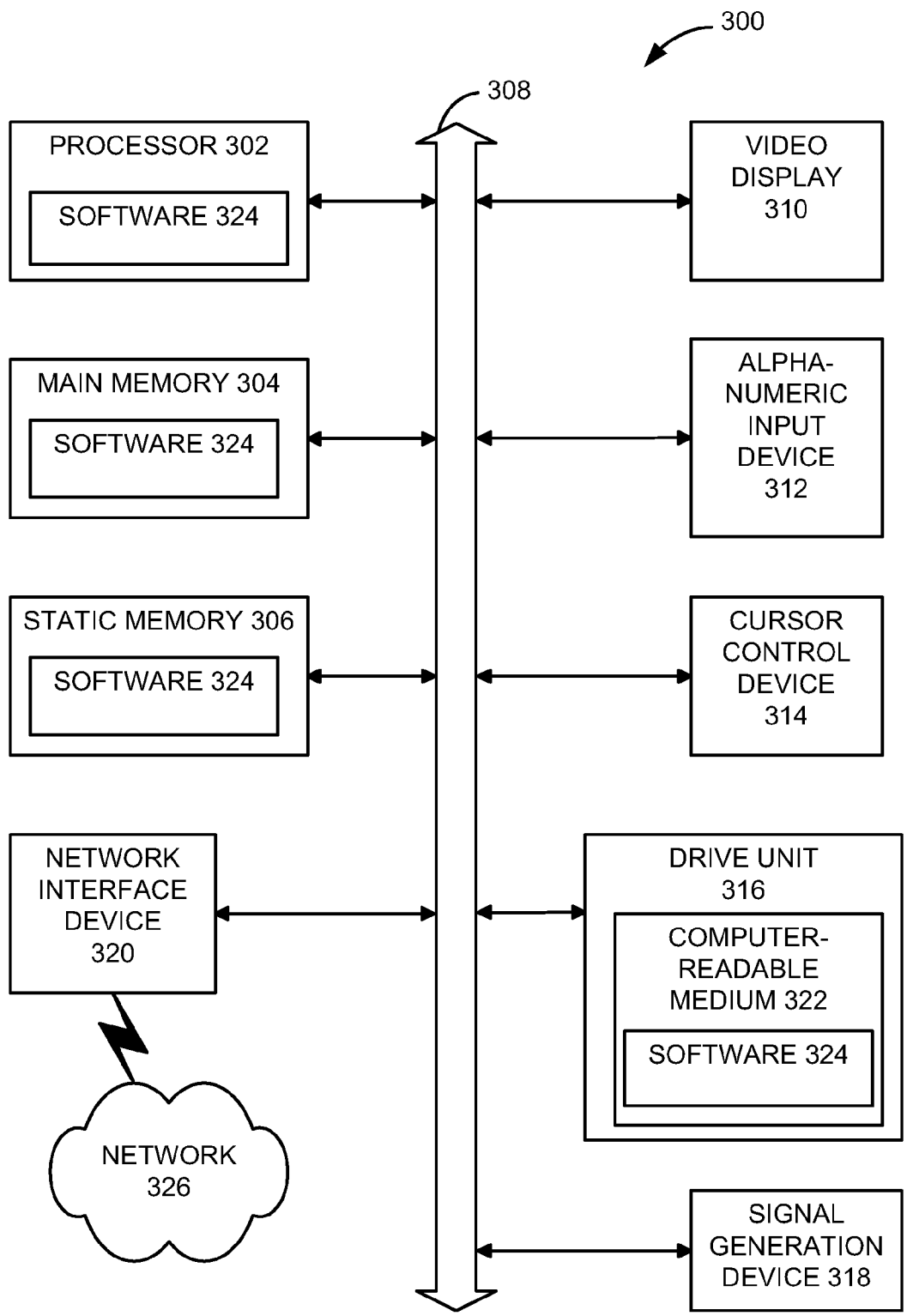
FIG. 8 illustrates a computer system in which embodiments of the disclosed techniques may be implemented, and illustrates the embodiment of the techniques in computer-readable media.

FIG. 8 is a block diagram of an exemplary computer system 300 within which a set of instructions, for causing the machine to perform any one or more of the techniques described herein, may be executed. In alternative embodiments, the computer system 300 operates as a standalone device or may be connected (e.g., networked) to other computer systems. In a networked deployment, the system 300 may operate in the capacity of a server or a client machine in a server-client network environment, or as a peer machine in a peer-to-peer (or distributed) network environment. The computer system 300 may be a personal computer (PC), a workstation such as those typically used by circuit designers, a set-top box (STB), a Personal Digital Assistant (PDA), a cellular telephone, a web appliance, a network router, switch or bridge, or any machine capable of executing a set of instructions that specify actions to be taken by that machine, and networked versions of these.

The exemplary computer system 300 includes a processor 302 (e.g., a central processing unit (CPU), a graphics processing unit (GPU) or both), a main memory 304 and a static memory 306, which communicate with each other via a bus 308. The computer system 300 may further include a video display unit 310 (e.g., a liquid crystal display (LCD) or a cathode ray tube (CRT)). The computer system 300 also includes an alphanumeric input device 312 (e.g., a keyboard), a user interface (UI) navigation device 314 (e.g., a mouse), a disk drive unit 316, a signal generation device 318 (e.g., a speaker) and a network interface device 320.

The disk drive unit 316 includes a computer-readable medium 322 on which is stored one or more sets of instructions and/or data structures (e.g., software 324) embodying embodiment of the various techniques disclosed herein. The software 324 may also reside, completely or at least partially, within the main memory 304 and/or within the processor 302 during execution thereof by the computer system 300, the main memory 304 and the processor 302 also constituting computer-readable media.

The software 324 and/or its associated data may further be transmitted or received over a network 326 via the network interface device 320 utilizing any one of a number of well-known transfer protocols (e.g., HTTP).

While the computer-readable medium 322 is shown in an exemplary embodiment to be a single medium, the term "computer-readable medium" should be taken to include a single medium or multiple media (e.g., a centralized or distributed database, and/or associated caches and servers) that store the one or more sets of instructions. The term "computer-readable medium" shall also be taken to include any medium that is capable of storing, encoding or carrying a set of instructions for execution by the machine and that cause the machine to perform any one or more of the methodologies of the disclosed techniques, or that is capable of storing, encoding or carrying data structures utilized by or associated with such a set of instructions. The term "computer-readable medium" shall accordingly be taken to include, but not be limited to, solid-state memories, optical and magnetic media such as discs, and carrier wave signals.

Embodiments of the disclosed techniques can also be implemented in digital electronic circuitry, in computer hardware, in firmware, in special purpose logic circuitry such as an FPGA (field programmable gate array) or an ASIC (application-specific integrated circuit), in software, or in combinations of them, which again all comprise examples of "computer-readable media." When implemented as software, such software can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a communication network.

Processors 302 suitable for the execution of a computer program include, by way of example, both general and special purpose microprocessors, and any one or more processors of any kind of digital computer. Generally, a processor will receive instructions and data from a read-only memory or a random access memory or both.

To provide for interaction with a user, the invention can be implemented on a computer having a video display 310 for displaying information to the user and a keyboard and a pointing device such as a mouse or a trackball by which the user can provide input to the computer. Other kinds of devices can be used to provide for interaction with a user as well. For example, feedback provided to the user can be any form of sensory feedback, such as visual feedback, auditory feedback, or tactile feedback; and input from the user can be received in any form, including acoustic, speech, or tactile input.

Aspects of the disclose techniques can employ any form of communication network. Examples of communication networks 326 include a local area network ("LAN"), a wide area network ("WAN"), and the Internet.

As timing jitter may be added to a time vector independent of amplitude noise added to a voltage vector, timing jitter resolution of a generated waveform is limited only by the program through which the timing jitter is added to the time vector. Further, the timing jitter may take on any form or magnitude, allowing it to be fully independent from the generated waveform. Time-domain amplitude noise is also completely controllable by the user. And finally, all of this realism can be added to arbitrary user-defined data patterns.

It should be understood that the disclosed techniques can be implemented in many different ways to the same useful ends as described herein. In short, it should be understood that the inventive concepts disclosed herein are capable of many modifications. To the extent such modifications fall within the scope of the appended claims and their equivalents, they are intended to be covered by this patent.

What is claimed is:

1. A method implementable in a computer system for generating a simulatable vector, comprising:
creating in the computer system a transition vector from a sequence of bits having a rise time and a fall time, wherein the transition vector comprises voltage values only at timings corresponding to midpoints of transitions in the bit sequence;
creating in the computer system a jittered transition vector from the transition vector, wherein the timing of the transitions in the jittered transition vector include timing jitter;
creating in the computer system an upscaled jittered transition vector from the jittered transition vector, wherein the upscaled jittered transition vector comprises additional points when compared to the jittered transition vector, wherein at least some of the additional points comprise corners of the sequence of bits, wherein voltages of the additional points in the upscaled jittered transition vector are determined by the sequence of bits, and wherein timing of the corners is determined in accordance with the rise time and the fall time; and
creating in the computer system a simulatable vector from the upscaled jittered transition vector, wherein voltages in the simulatable vector are separated by a time step.

2. The method of claim 1, further comprising adding amplitude noise to the simulatable vector.

3. The method of claim 2, wherein the amplitude noise is defined in terms of a probability density function.

4. The method of claim 1, wherein the timing of the transitions in the jittered transition vector are recorded in a jittered transition timing vector associated with the jittered transition vector.

5. The method of claim 1, wherein the timing of the upscaled jittered transition vector are recorded in an upscaled jittered transition timing vector associated with the upscaled jittered transition vector.

6. The method of claim 1, wherein the timing jitter is defined in terms of a probability density function.

7. A method implementable in a computer system for generating a simulatable vector, comprising:
   creating in the computer system a transition vector from a sequence of bits having a rise time and a fall time, wherein the transition vector comprises voltage values only at timings corresponding to midpoints of transitions in the bit sequence;
   creating in the computer system an upscaled transition vector from the transition vector, wherein the upscaled transition vector comprises additional points when compared to the transition vector, wherein at least some of the additional points comprise corners of the sequence of bits, and wherein timing of the corners is determined in accordance with the rise time and the fall time; and
   creating in the computer system a simulatable vector from the upscaled transition vector;
   wherein the simulatable vector comprises amplitude noise and/or timing jitter.

8. The method of claim 7, wherein timing jitter is added after creating of the transition vector and before creation of the upscaled transition vector.

9. The method of claim 7, wherein timing jitter is added after creation of the upscaled transition vector.

10. The method of claim 7, wherein the voltages of the additional points in the upscaled jittered transition vector are determined by the sequence of bits.

11. The method of claim 7, wherein the simulatable vector comprises voltage points separated by a time step.

12. The method of claim 7, wherein the amplitude noise and/or timing jitter are defined in terms of probability density functions.

13. A method implementable in a computer system for generating a simulatable vector, comprising:
   creating in the computer system a transition vector from a sequence of bits, wherein the transition vector comprises voltage values only at timings corresponding to midpoints of transitions in the bit sequence;
   creating in the computer system a jittered transition vector from the transition vector, wherein the timing of the transitions in the jittered transition vector include timing jitter;
   creating in the computer system an upscaled jittered transition vector from the jittered transition vector, wherein the upscaled jittered transition vector comprises additional points when compared to the jittered transition vector, wherein at least some of the additional points comprise corners of the sequence of bits, and wherein the timing of the corners is determined by the shape of the sequence of bits; and
   re-sampling the upscaled jittered transition vector in the computer system to form a simulatable vector.

14. The method of claim 13, wherein the timing of the corners is determined in accordance with a rise time and/or fall time of the bits in the sequence of bits.

15. The method of claim 13, wherein the timing jitter is random between elements in the transition vector.

16. The method of claim 13, further comprising adding amplitude noise to the simulatable vector.

17. A method implementable in a computer system for generating a simulatable vector, comprising:
   creating in the computer system a jittered transition vector from a sequence of bits having a rise time and a fall time, wherein the transition vector comprises voltage values only at timings corresponding to midpoints of idealized transitions in the bit sequence, wherein the timings are jittered; and
   creating in the computer system a simulatable upscaled jittered transition vector from the jittered transition vector, wherein the upscaled jittered transition vector comprises additional points when compared to the jittered transition vector, wherein at least some of the additional points comprise corners of the sequence of bits, wherein voltages of the additional points in the upscaled jittered transition vector are determined by the sequence of bits, and wherein the timing of the corners is determined in accordance with the rise time and the fall time.

18. The method of claim 17, further comprising adding amplitude noise to the simulatable upscaled jittered transition vector.

19. The method of claim 17, wherein the jittered timings vary randomly from element to element in the jittered transition vector.

20. The method of claim 17, wherein the timings are jittered by adding a jitter vector to a transition timing vector.

21. A method implementable in a computer system for simulating a sequence of bits through a channel, comprising:
   creating in the computer system a transition vector from a sequence of bits having a rise time and a fall time, wherein the transition vector comprises voltage values only at timings corresponding to midpoints of transitions in the bit sequence;
   creating in the computer system a jittered transition vector from the transition vector, wherein the timing of the transitions in the jittered transition vector include timing jitter;
   creating in the computer system an upscaled jittered transition vector from the jittered transition vector, wherein the upscaled jittered transition vector comprises additional points when compared to the jittered transition vector, wherein at least some of the additional points comprise corners of the sequence of bits, wherein voltages of the additional points in the upscaled jittered transition vector are determined by the sequence of bits, and wherein timing of the corners is determined in accordance with the rise time and the fall time; and
   creating in the computer system a simulatable vector from the upscaled jittered transition vector, wherein voltages in the simulatable vector are separated by a time step; and
   simulating in the computer system the transmission of the simulatable vector through the channel.

22. The method of claim 21, further comprising adding amplitude noise to the simulatable vector prior to the step of simulating.

23. The method of claim 21, wherein the timing of the transition in the jittered transition vector are recorded in a jittered transition timing vector associated with the jittered transition vector.

24. The method of claim 21, wherein the timing of the upscaled jittered transition vector are recorded in an upscaled jittered transition timing vector associated with the upscaled jittered transition vector.

* * * * *

UNITED STATES PATENT AND TRADEMARK OFFICE
CERTIFICATE OF CORRECTION

| | | |
|---|---|---|
| PATENT NO. | : 8,032,350 B2 | Page 1 of 1 |
| APPLICATION NO. | : 11/926682 | |
| DATED | : October 4, 2011 | |
| INVENTOR(S) | : Timothy M. Hollis | |

It is certified that error appears in the above-identified patent and that said Letters Patent is hereby corrected as shown below:

On the Title page, in field (56), under "Other Publications", in column 2, line 3, delete "(Psuedo-Random" and insert -- (Pseudo-Random --, therefor.

In column 11, line 26, in Claim 8, before "timing jitter" insert -- the --.

In column 11, line 29, in Claim 9, before "timing jitter" insert -- the --.

Signed and Sealed this
Twentieth Day of December, 2011

David J. Kappos
*Director of the United States Patent and Trademark Office*